United States Patent
Proebsting

(10) Patent No.: US 6,798,629 B1
(45) Date of Patent: Sep. 28, 2004

(54) OVERVOLTAGE PROTECTION CIRCUITS THAT UTILIZE CAPACITIVELY BOOTSTRAPPED VARIABLE VOLTAGES

(75) Inventor: Robert J. Proebsting, Morgan Hill, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 284 days.

(21) Appl. No.: 09/891,906

(22) Filed: Jun. 26, 2001

Related U.S. Application Data

(60) Provisional application No. 60/298,668, filed on Jun. 15, 2001.

(51) Int. Cl.[7] ............................................. H02H 3/22
(52) U.S. Cl. ................................. 361/56; 361/111
(58) Field of Search ....................... 361/56, 54, 57, 361/86, 90, 91, 111, 91.1, 91.5, 118

(56) References Cited

U.S. PATENT DOCUMENTS

| | | | |
|---|---|---|---|
| 4,508,978 A | 4/1985 | Reddy ........................ 307/443 |
| 4,631,429 A | 12/1986 | Riebeek ....................... 307/490 |
| 4,853,560 A | 8/1989 | Iwamura et al. ........... 307/296.1 |
| 5,270,589 A | 12/1993 | Sawada et al. .............. 307/475 |
| 5,319,259 A | 6/1994 | Merrill ........................ 307/443 |
| 5,369,317 A | * 11/1994 | Casper et al. ................. 326/87 |
| 5,397,941 A | 3/1995 | Merrill ........................ 307/475 |
| 5,410,267 A | 4/1995 | Haycock et al. .............. 326/81 |
| 5,422,592 A | 6/1995 | Asahina ....................... 327/427 |
| 5,477,172 A | 12/1995 | Schnizlein ..................... 327/99 |
| 5,495,185 A | 2/1996 | Goto .......................... 326/81 |
| 5,525,933 A | 6/1996 | Matsuki et al. .............. 327/309 |
| 5,534,795 A | 7/1996 | Wert et al. .................... 326/81 |
| 5,541,534 A | 7/1996 | Cao et al. ..................... 326/81 |
| 5,541,546 A | * 7/1996 | Okumura ..................... 327/333 |
| 5,559,455 A | 9/1996 | McPartland ................... 327/53 |
| 5,576,635 A | * 11/1996 | Partovi et al. ................ 326/27 |
| 5,646,809 A | 7/1997 | Motley et al. ................ 361/56 |
| 5,736,887 A | 4/1998 | Spence ....................... 327/333 |
| 5,744,982 A | 4/1998 | Chu ............................ 326/83 |
| 5,852,540 A | * 12/1998 | Haider ........................ 361/111 |
| 5,909,110 A | * 6/1999 | Yuan et al. .................. 323/282 |
| 5,966,035 A | 10/1999 | Lien ............................ 327/89 |
| 5,973,534 A | * 10/1999 | Singh ......................... 327/309 |
| 5,999,459 A | * 12/1999 | Liu ........................ 365/189.06 |
| 6,005,379 A | * 12/1999 | Wong et al. ................. 323/313 |
| 6,049,445 A | * 4/2000 | Gauthier et al. .............. 361/56 |
| 6,172,383 B1 | * 1/2001 | Williams ..................... 257/173 |
| 6,281,713 B1 | * 8/2001 | Kim ............................ 327/55 |
| 6,380,570 B1 | * 4/2002 | Voldman ..................... 257/288 |
| 6,400,546 B1 | * 6/2002 | Drapkin et al. ............. 361/111 |
| 6,504,424 B1 | * 1/2003 | Heminger et al. ........... 327/566 |

* cited by examiner

*Primary Examiner*—Brian Sircus
*Assistant Examiner*—Danny Nguyen
(74) *Attorney, Agent, or Firm*—Myers Bigel Sibley & Sajovec

(57) ABSTRACT

Overvoltage protection circuits include a pass transistor having first and second current carrying terminals electrically connected to an input signal line and an output signal line, respectively, and a voltage clamping circuit. The voltage clamping circuit is electrically connected to a power supply line and a gate of the pass-transistor and dynamically clamps a capacitively bootstrapped voltage at a gate of the pass transistor within a first range so that the output voltage as well as the magnitudes of all gate-to-source, gate-to-drain and drain-to-source voltages across the pass transistor and all transistors within the voltage clamping circuit do not exceed a level in excess of about Vdd when Vin=2Vdd, where Vin equals a voltage of an input signal applied to the input signal line and Vdd equals a power supply voltage on the power supply line.

22 Claims, 3 Drawing Sheets

OVERVOLTAGE PROTECTION CIRCUITS THAT UTILIZE CAPACITIVELY BOOTSTRAPPED VARIABLE VOLTAGES

The present application claims priority to U.S. Provisional Application Ser. No. 60/298,668, filed Jun. 15, 2001, the disclosure of which is hereby incorporated herein by reference.

FIELD OF THE INVENTION

The present invention relates to integrated circuit devices and, more particularly, to integrated circuits that provide overvoltage protection.

BACKGROUND OF THE INVENTION

Signal buffers are frequently coupled to input or input/output pads on an integrated circuit substrate so that external signals having voltage swings that are incompatible with the voltage levels used by devices on the integrated substrate can be level shifted and/or compressed to compatible levels. Hereinafter, input and input/output pads will be referred to as I/O pads. As illustrated by FIG. 1, a conventional CMOS input stage 100 may be used as a buffer for external signals received at an I/O pad 101. The CMOS input stage 100 may comprise a CMOS inverter 102 having an input connected to the I/O pad 101. As will be understood by those skilled in the art, the CMOS inverter 102 comprises a PMOS pull-up transistor 103 and an NMOS pull-down transistor 104. The output 105 of the CMOS inverter 102 is electrically connected to the drain of the NMOS pull-down transistor 104 and to the drain of the PMOS pull-up transistor 103, as illustrated. Because the PMOS pull-up transistor 103 and NMOS pull-down transistor 104 are connected in a totem pole arrangement between a positive power supply line and a ground reference potential, the voltage swing at the output 105 of the CMOS inverter 102 ranges from a minimum value of 0 Volts to a maximum value equal to the value of the positive power supply line Vdd.

Unfortunately, if an external signal received by the I/O pad 101 has an excessive positive voltage swing, the gate-to-drain voltage $V_{GD}$ across the PMOS pull-up transistor 103 and the gate-to-source voltage $V_{GS}$ and the gate-to-drain voltage $V_{GD}$ across the NMOS pull-down transistor 104 may exceed the ratings of these transistors and cause device breakdown. Moreover, even if the maximum voltage supplied by the external signal to the CMOS inverter 102 is not sufficient to cause breakdown, it may be high enough to cause degradation of the transfer characteristics of the CMOS inverter 102 if exposure to the high external signal is prolonged.

Attempts have been made to protect input buffers from external signals having excessive voltages. One such attempt is disclosed in U.S. Pat. No. 5,319,259 to Merrill, entitled "Low Voltage Input and Output Circuits With Overvoltage Protection". As illustrated by FIG. 2, which is a reproduction of FIG. 9 from the '259 patent, an input stage 210 includes an input pad 200, a zener diode 201, an NMOS pass transistor 202, a supply terminal 203, a PMOS feedback transistor 204 and a CMOS inverter 205. The CMOS inverter 205 comprises an NMOS pull-down transistor 208 connected in a totem pole arrangement with a PMOS pull-up transistor 207. As illustrated, the PMOS feedback transistor 204 is electrically connected between an input 209 of the CMOS inverter 205 and the positive supply terminal 203. A gate of the PMOS feedback transistor 204 is electrically connected to an output 206 of the CMOS inverter 205.

As will be understood by those skilled in the art, the zener diode 201 provides overvoltage protection for external signals having voltages in excess of about six (6) Volts. However, the NMOS pass transistor 202 provides overvoltage protection for external signals having voltages in a range between about six (6) Volts and the magnitude of the power supply voltage Vdd applied to the supply terminal 203. For example, if an external signal having a voltage of 5 Volts is applied to the input pad 200 and the operating supply voltage is 2.5 Volts, the NMOS pass transistor 202 will initially reduce the 5 Volt signal level to an input node 209 at the input 209 that is equal to Vdd-$V_{TH-pass}$, where $V_{TH-pass}$ is the threshold voltage of the NMOS pass transistor 202, perhaps 0.5 Volts. The voltage $V_{209}$ at the input of the CMOS inverter 205 is sufficient to cause the output 206 of the CMOS inverter 205 to be pulled down to a logic 0 level. As illustrated, the logic 0 signal at the output 206 is fed back to the PMOS feedback transistor 204, which then turns on to pull input node 209 up to the full supply voltage Vdd.

The PMOS feedback transistor 204 should be designed to have relatively weak pull-up characteristics so that an external signal transitioning from a logic 1 level to a logic 0 level will be able to overcome the pull-up logic force provided by the PMOS feedback transistor 204. The PMOS feedback transistor 204 may be made relatively weak by making its channel relatively long or relatively narrow. Unfortunately, when an external signal transitions from a logic 1 level to a logic 0 level, the NMOS pass transistor 202 and the PMOS feedback transistor 204 initially operate as a pair of resistors connected in series between the input pad 200 and the supply terminal 203. This series resistive path to Vdd slows the pull-down transition. More significantly, the series resistive path prevents the input from meeting a typical input specification of nominally zero current, which presents a marketing problem for a product using this circuit.

Thus, notwithstanding these attempts to provide signal buffers that are capable of compressing external signal levels to internal voltages that are compatible with on-chip circuitry, there continues to be a need for signal buffers that occupy low area, have low power consumption requirements and limit all gate-to-source, gate-to-drain and drain-to-source voltages to safe voltages for the transistors contained therein.

SUMMARY OF THE INVENTION

Overvoltage protection circuits according to embodiments of the present invention protect devices connected thereto by clamping input signals having excessive positive voltages in an efficient manner that does not damage either the overvoltage protection circuit itself or the other circuits connected thereto. One preferred overvoltage protection circuit includes a first NMOS pass transistor connected between an input signal line (IN) and an output signal line (OUT) to which an input of a load or logic device (e.g., inverter, multi-input logic gate) is connected. A gate of the first pass transistor is preferably connected to a signal line upon which a variable positive voltage level is maintained.

When an input signal (Vin) having a logic 0 level (low voltage) is provided to the input signal line IN, the first pass transistor operates as a normally-on transistor that passes the input signal Vin directly to the output signal line OUT. However, as the input signal Vin transitions from a logic 0 level to a voltage level above a supply voltage Vdd during a pull-up interval, the first pass transistor transitions from a highly conductive on-state to an off-state. In particular, the first pass transistor transitions to an off-state when a positive voltage on the output signal line OUT equals Vgate−Vth, where Vgate is the gate voltage of the first pass transistor and Vth is a threshold voltage of the first pass transistor. At this point, the first pass transistor blocks further increases in the magnitude of the input signal Vin from being passed to the output signal line OUT. By action of the first pass transistor, the output signal line OUT is thereby clamped at a maximum level of Vgate−Vth, with further increases in Vin appearing across the drain and source terminals of the first pass transistor.

To prevent clamping of the output signal line OUT at a positive voltage below Vdd, it is advantageous to provide a gate voltage of the first pass transistor above Vdd, because the source voltage can follow the drain voltage only to the gate voltage less the threshold voltage of the first pass transistor. To achieve this goal, the gate of the first pass transistor is connected to a circuit that clamps the gate of the first pass transistor within a range of voltages. This range of gate voltages extends from a minimum clamped level to a maximum clamped level. In particular, a width of the first pass transistor is set at a relatively high level so that significant capacitive coupling (i.e., gate-to-channel capacitance) is provided between the signal lines IN and OUT and the gate of the first pass transistor. Thus, as the magnitude of the input signal Vin increases, the magnitude of the voltage at the gate of the first pass transistor increases in a self-bootstapping manner, within the range permitted by the clamping circuit.

The clamping circuit preferably clamps the voltage at the gate of the first pass transistor at a maximum level that enables the output signal line OUT to reach a maximum level of about Vdd. To achieve this preferred maximum logic 1 voltage on the output signal line OUT, the clamping circuit preferably clamps the gate of the first pass transistor at a maximum voltage of about Vdd+α, where a is preferably equal to Vth, and Vth equals a threshold voltage of the first pass transistor. As will be discussed in detail below, this first transistor will pass input voltages that are below or equal to Vdd to the output signal line OUT, but will not pass voltages above Vdd to the output signal line OUT.

According to a preferred aspect of this embodiment, the clamping circuit comprises first and second diodes electrically connected in antiparallel between a second power supply line and a gate of the first pass transistor. These first and second diodes operate to clamp the voltage appearing at the gate of the first pass transistor to within a desired range of voltages. These first and second diodes may comprise first and second NMOS transistors, respectively. According to a preferred aspect of this embodiment, a source of the first NMOS transistor, which operates as a cathode of the first diode, is electrically connected to a drain and gate of the second NMOS transistor and to the gate of the first pass transistor. The drain and gate of the second NMOS transistor operate as an anode of the second diode. A source of the second NMOS transistor is electrically connected to a drain and gate of the first NMOS transistor and to the second power supply line. According to an additional preferred aspect of this embodiment, a width of the first pass transistor is relatively large relative to the widths of the first and second NMOS transistors operating as diodes to thereby provide a high degree of capacitive coupling between the input and output signal lines and the gate of the first pass transistor. This high degree of capacitive coupling causes the voltage on the gate of the first pass transistor to immediately rise above the minimum clamped level as the input signal commences a transition from a logic 0 level to a logic 1 level.

According to a second embodiment of the present invention, an overvoltage protection circuit is provided that comprises first and second pass transistors electrically connected in parallel between an input signal line (IN) and an output signal line (OUT). A first power supply line is electrically coupled to a gate of the second pass transistor so that the gate of the second pass transistor is held at a fixed high voltage (e.g., Vdd). This second pass transistor improves the pull-down speed of the overvoltage protection circuit by turning on before the first pass transistor when the input signal line IN is switching from a high positive voltage to a logic 0 level during a pull-down interval. A voltage clamping circuit is also provided. This voltage clamping circuit is similar to the clamping circuit described above with respect to the first embodiment, however, the first and second diodes are electrically connected in antiparallel between a second power supply line and a gate of the first pass transistor. The first and second power supply lines may be electrically connected together so that the magnitude of the supply voltages is the same.

The clamping circuit clamps a voltage at the gate of the first pass transistor at a minimum voltage of about Vdd2−$V_{TN1}$ in response to application of a logic 0 input signal Vin, where $V_{TN1}$ is a threshold voltage of the first NMOS transistor. The gate of the first pass transistor is also clamped at a maximum voltage of Vdd2+$V_{TN2}$ in response to a positive transition of an input signal Vin by an amount equal to about $V_{TN1}$+$V_{TN2}$ (the exact amount depends on the ratio of the channel capacitance of the first pass transistor relative to the combined capacitance of the first and second diodes within the clamping circuit).

According to a third embodiment of the present invention, a signal buffer comprises a first pass transistor electrically connected between an input signal line and an output signal line. A preferred clamping circuit is provided to dynamically clamp a voltage at a gate of the first pass transistor. In particular, the clamping circuit dynamically clamps a voltage at the gate of the first pass transistor to within a first range so that a full logic 1 voltage (e.g., Vdd1 but no more) can be established on the output signal line and magnitudes of all gate-to-source, gate-to-drain and drain-to-source voltages across any transistor will not exceed a level in excess of Vdd, even when Vin is raised to a level as high as 2Vdd.

DESCRIPTION OF PREFERRED EMBODIMENTS

Figure 1:
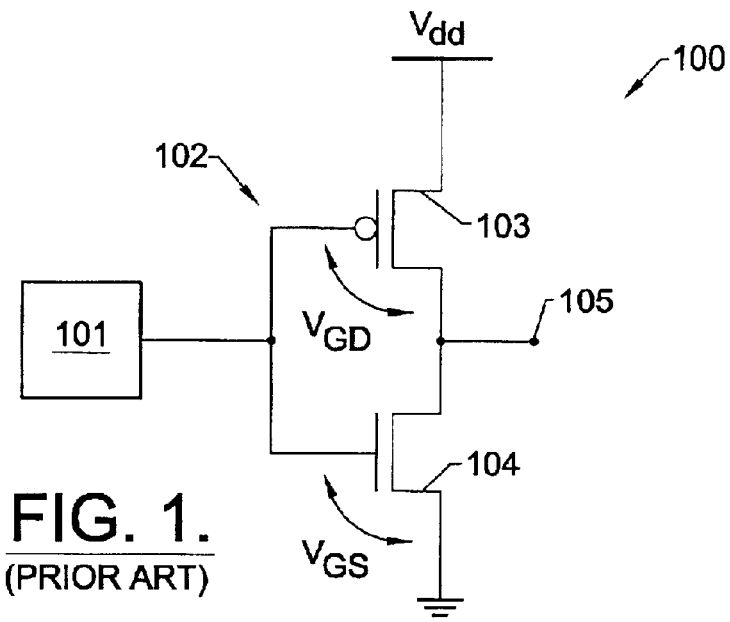
FIG. 1 is an electrical schematic of a conventional input buffer.
Figure 2:
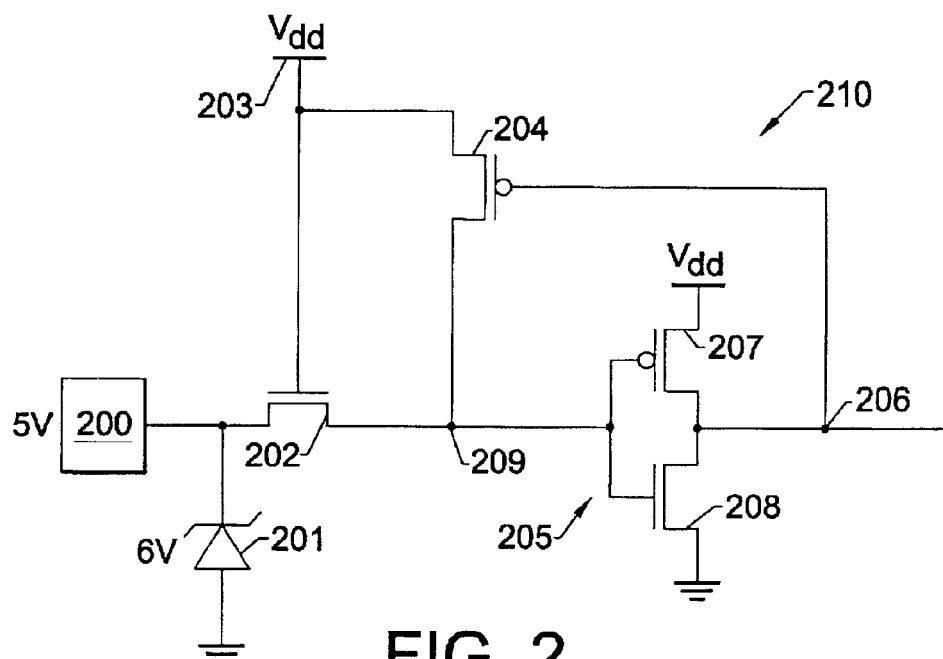
FIG. 2 is an electrical schematic of a conventional input buffer having overvoltage protection circuitry therein.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be through and complete, and will fully convey the scope of the invention to those skilled in the art. Like reference numerals refer to like elements throughout and signal lines and signals thereon may be referred to by the same reference characters. Moreover, the voltages and signal levels described herein assume a ground reference level of zero (0) Volts, however, as will be understood by those skilled in the art, non-zero ground reference levels may be used and the described voltage and signal levels may be adjusted accordingly.

Figure 3A:
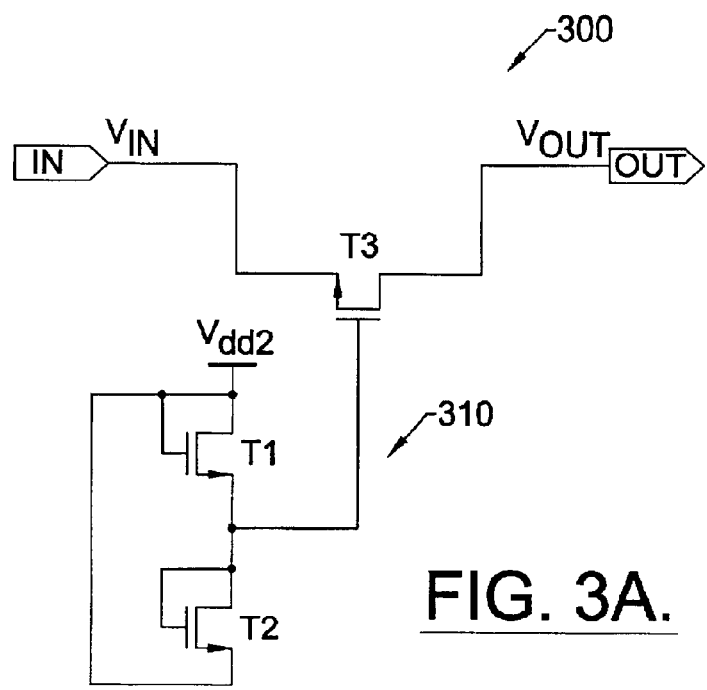
FIG. 3A is an electrical schematic of an overvoltage protection circuit according to a first embodiment of the present invention.
Figure 3B:
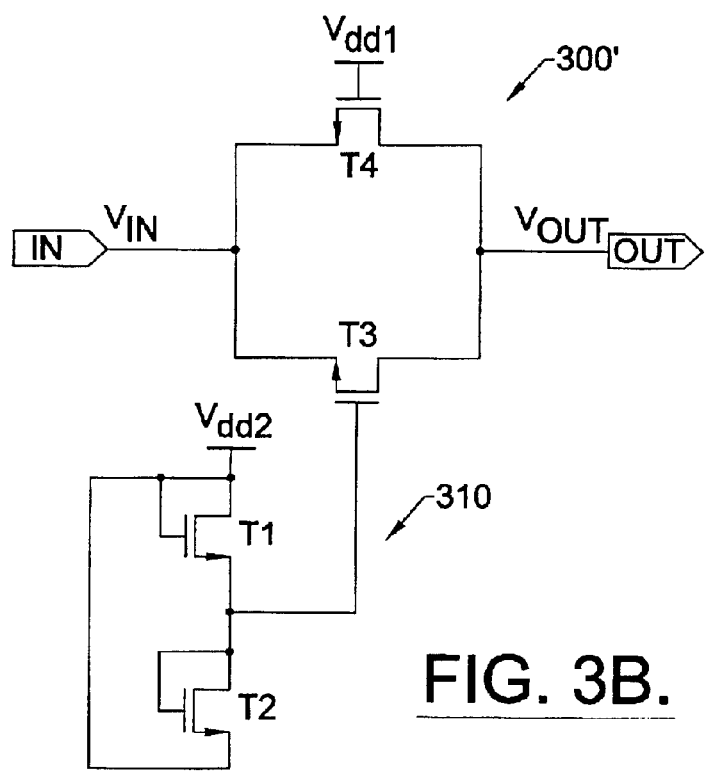
FIG. 3B is an electrical schematic of an overvoltage protection circuit according to a second embodiment of the present invention.
Figure 4:
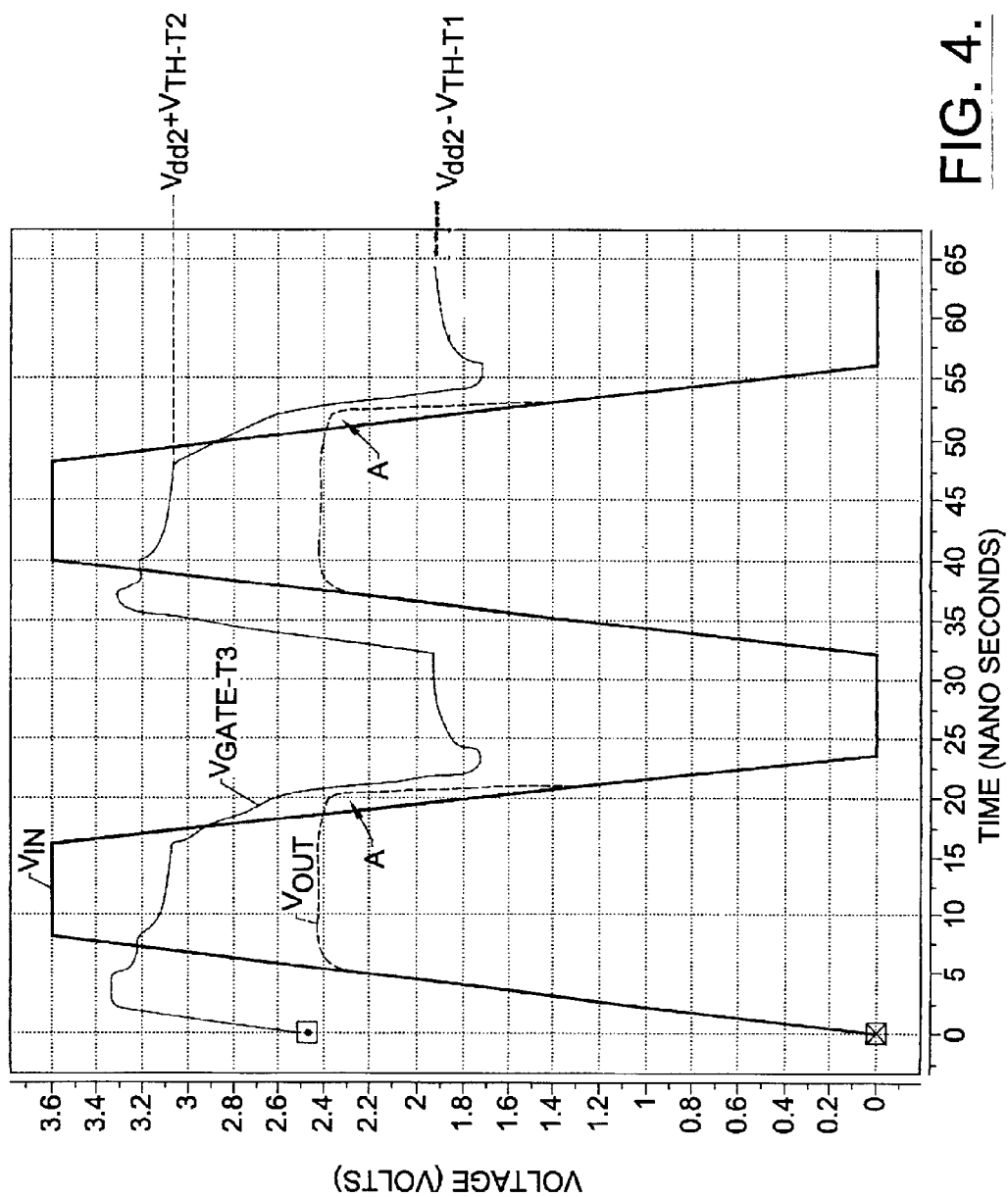
FIG. 4 is a timing diagram that illustrates operation of the signal buffer of FIG. 3B.

Referring now to FIGS. 3A–3B and FIG. 4, overvoltage protection circuits according to embodiments of the present invention will be described. In particular, FIG. 3A is an electrical schematic of an overvoltage protection circuit 300 according to a first embodiment of the present invention. As illustrated, the overvoltage protection circuit 300 comprises a first pass transistor T3 and a voltage clamping circuit 310. The first pass transistor T3 is electrically coupled to an input signal line (IN) and an output signal line (OUT). In particular, a first current carrying terminal of the first pass transistor T3 is electrically connected to the input signal line IN and a second current carrying terminal is electrically connected to the output signal line OUT. When the input signal line IN is at a lower voltage than the output signal line OUT, the first current carrying terminal of the first pass transistor T3 will operate as a source and the second current carrying terminal will operate as a drain. The reverse is true when the input signal line IN is at a higher voltage than the output signal line OUT. However, for convenience, the first current carrying terminal of the first pass transistor T3, which has been designated by an arrow in FIG. 3A, will be treated as a source herein.

In FIG. 3B, an overvoltage protection circuit 300' according to a second embodiment of the present invention is illustrated. This second embodiment is similar to the first embodiment, however, a second pass transistor T4 is provided in parallel with the first pass transistor T3. A gate of the second pass transistor T4 is responsive to a positive voltage and is preferably electrically coupled to a supply line Vdd1. The first current carrying terminal of the second pass transistor T4 is also designated by an arrow and will be referred to herein as a source.

The first pass transistor T3 in FIG. 3A and the first and second pass transistors T3 and T4 in FIG. 3B are illustrated as NMOS enhancement mode transistors having positive threshold voltages. In particular, the first pass transistor T3 comprises an NMOS transistor having a channel width sufficient to have a relatively large gate-to-channel capacitance and also sufficient to quickly drive a capacitive load (not shown) connected to the output signal line OUT. The second pass transistor T4 is optional and comprises an NMOS transistor having a channel width sufficient to pull the output signal line OUT low when the input signal line IN is being switched from a positive voltage to a low voltage.

The gate of the first pass transistor T3 is electrically connected to a preferred voltage clamping circuit 310. The voltage clamping circuit 310 preferably occupies very limited area on an integrated circuit substrate and, as illustrated, may consist of first and second NMOS transistors T1 and T2 configured as MOS diodes. These MOS diodes are preferably connected in antiparallel between a second power supply line Vdd2 and the gate of the first pass transistor T3. The term "antiparallel" is used herein to describe that a cathode of one diode is connected to an anode of the other diode and vice versa. Thus, the cathode of the first diode (i.e., source of NMOS transistor T1) is electrically connected to the anode of the second diode (i.e., gate and drain of NMOS transistor T2) and the cathode of the second diode (i.e., source of NMOS transistor T2) is electrically connected to the anode of the first diode (i.e., gate and drain of NMOS transistor T1). The first and second NMOS transistors T1 and T2 may be the same size and are preferably considerably narrower than the first and second pass transistors T3 and T4. The first and second NMOS transistors T1 and T2 are kept small so that their capacitance is low relative to the gate-to-channel capacitance of the first pass transistor T3. The threshold voltages of the first and second NMOS transistors T1 and T2 may equal a threshold voltage of the first pass transistor T3.

Operation of the overvoltage protection circuits 300 and 300' will now be described with reference to FIGS. 3A–3B and the timing diagram of FIG. 4. An input signal Vin having an initial logic 0 level (e.g., 0 Volts) may be provided on the input signal line IN. Because the gate of the second pass transistor T4 is maintained at a full logic 1 level (e.g., Vdd1=2.5 Volts), the gate-to-source voltage across the second pass transistor T4 exceeds its threshold voltage (e.g., $V_{TH-T4}$=0.55 Volts). Accordingly, the second pass transistor T4 is turned on when an input signal Vin having a logic 0 level is received and provides a conductive path to the output signal line OUT. Accordingly, the output signal line OUT follows the input signal line IN to its low voltage (i.e., 0 Volts). Then, as the input signal Vin begins to rise from a logic 0 level to a logic 1 level during a pull-up interval, the output signal Vout tracks the rise in the input signal Vin. Once the output signal Vout increases to a level equal to Vdd1−$V_{TH-T4}$, the second pass transistor T4 turns off. With respect to FIG. 4, this turn-off point may occur when the input signal Vin has reached a voltage of 1.95 Volts (1.95= Vdd1−$V_{TH-T4}$).

However, because the width of the first pass transistor T3 is relatively large, the gate-to-channel capacitance across the first pass transistor T3 may provide a high degree of capacitive coupling between the gate of the first pass transistor T3 and its collective input (IN), output (OUT) and channel. This high degree of capacitive coupling will cause the voltage on the gate of the first pass transistor T3 to be "self-bootstrapped" up in voltage as the Input signal Vin and output signal Vout rise during a pull-up interval. The greater width of the first pass transistor T3 relative to the first and second NMOS transistors T1 and T2 (clamping transistors) enhance the self-bootstrapping. As illustrated best by FIG. 4, the voltage on the gate of the first pass transistor T3 will rise to a level in excess of Vdd1 during the pull-up interval. This higher gate voltage (relative to the fixed gate voltage of the second pass transistor T4, if present) will cause the output signal Vout to rise to a level in excess of Vdd1−$V_{TH-T4}$. In particular, the output signal Vout will rise to a level of $V_{GATE-T3}$−$V_{TH-T3}$, where $V_{GATE-T3}$ is the gate voltage of the first pass transistor T3 and $V_{TH-T3}$ is the threshold voltage of the first pass transistor T3.

According to a preferred aspect of these embodiments, the diode formed by the second NMOS transistor T2 within the voltage clamping circuit 310 operates to clamp the gate voltage of the first pass transistor T3 at a maximum level of Vdd2+$V_{TH-T2}$, which means the output signal Vout will rise as the input signal Vin rises, but the output will rise only to a maximum level of (Vdd2+$V_{TH-T2}$)−$V_{TH-T3}$. As illustrated by the tables below and FIG. 4, this maximum clamping voltage is achieved in response to a positive input voltage transition somewhat in excess of $V_{TN1}$+$V_{TN2}$, the sum of the threshold voltages being the approximate range over which the clamped voltage on the gate of the first pass transistor varies during positive and negative transistions of the input signal. Accordingly, if the second NMOS transistor T2 and the first pass transistor T3 have about the same threshold voltage so that $V_{TH-T2}=V_{TH-T3}$, then the output signal line OUT can be driven to a maximum logic 1 level of Vdd2 when the input signal Vin rises to or exceeds Vdd2.

TABLE 1 below shows the terminal voltages for transistors T1–T4 in FIG. 3B when Vin>Vdd2. As long as the input signal Vin does not exceed Vdd2 by an excessive amount (e.g., Vin>2Vdd), the gate-to-source, gate-to-drain and drain-to-source terminal voltages of all transistors T1, T2, T3 and T4 will remain within acceptable levels (i.e., all will be less than or equal to Vdd2). Furthermore, Vout will be limited to only Vdd2, which is a safe voltage for circuitry (e.g., logic gates, buffers, etc.) connected to the output signal line OUT.

TABLE 1

| | $V_{GS}$ | $V_{GD}$ | $V_{DS}$ |
|---|---|---|---|
| T1 | $-V_{TH-T2}$ | 0 | $-V_{TH-T2}$ |
| T2 | $V_{TH-T2}$ | 0 | $V_{TH-T2}$ |
| T3 | $(V_{dd2} + V_{TH-T2}) - V_{IN}$ | $V_{TH-T3}$ | $V_{dd2} + V_{TH-T2} - V_{TH-T3} - V_{IN}$ |
| T4 | $V_{dd1} - V_{IN}$ | $V_{dd1} - (V_{dd2} + V_{TH-T2} - V_{TH-T3})$ | $(V_{dd2} + V_{TH-T2} - V_{TH-T3}) - V_{IN}$ |

Moreover, if the threshold voltages of all NMOS transistors T1–T4 are equal and set to $V_{TH}$ and Vdd1=Vdd2=Vdd, then the relationships of TABLE 1 can be simplified to those shown by TABLE 2. None of the voltages in Table 2 has a magnitude greater than Vdd.

TABLE 2

| | $V_{GS}$ | $V_{GD}$ | $V_{DS}$ |
|---|---|---|---|
| T1 | $-V_{TH}$ | 0 | $-V_{TH}$ |
| T2 | $V_{TH}$ | 0 | $V_{TH}$ |
| T3 | $V_{dd} + V_{TH} - V_{IN}$ | $V_{TH}$ | $V_{dd} - V_{IN}$ |
| T4 | $V_{dd} - V_{IN}$ | 0 | $V_{dd} - V_{IN}$ |

Accordingly, assuming each of the terminals of the transistors T1–T4 in FIG. 3B can support a maximum gate-to-source, drain-to-source and gate-to-drain voltage of Vdd without breakdown or deterioration, then the overvoltage protection circuits 300 and 300' of FIGS. 3A–3B can be used in circuits where input voltages Vin having a maximum positive voltage up to 2Vdd are present.

Referring again to FIGS. 3A–3B and 4, the downward transition of the input signal Vin from a maximum positive voltage to a logic 0 level during a pull-down interval will cause the voltage at the gate of the first pass transistor T3 to be capacitively coupled toward a lower voltage level. As the gate voltage of the first pass transistor T3 falls, it is clamped at $Vdd2-V_{TH-T1}$, where $V_{TH-T1}$ is the threshold voltage of the first NMOS transistor T1 within the voltage clamping circuit 310. The terminal voltages associated with the transistors T1–T4 when the input signal Vin is held at a logic 0 level are illustrated by TABLE 3. None of these terminal voltages is in excess of Vdd.

TABLE 3

| | $V_{GS}$ | $V_{GD}$ | $V_{DS}$ |
|---|---|---|---|
| T1 | $V_{TH-T1}$ | 0 | $V_{TH-T1}$ |
| T2 | $-V_{TH-T1}$ | 0 | $-V_{TH-T1}$ |

TABLE 3-continued

| | $V_{GS}$ | $V_{GD}$ | $V_{DS}$ |
|---|---|---|---|
| T3 | $V_{dd2} - V_{TH-T1}$ | $(V_{dd2} - V_{TH-T1})$ | 0 |
| T4 | $V_{dd1}$ | $V_{dd1}$ | 0 |

As illustrated by FIG. 4, the output signal Vout will not immediately follow the negative transition on the input signal Vin as the input signal Vin falls below the level of the output signal Vout. This lagging behavior between the output signal Vout and the input signal Vin (see, e.g., point A on FIG. 4) is due to the fact that the first and second pass transistors T3 and T4 will not begin to conduct during the pull-down interval until $V_{GS-T3}>V_{TH-T3}$ or $V_{GS-T4}>V_{TH-T4}$. This condition is typically not met until the input signal Vin has fallen below the turn-on point equal to $Vdd1-V_{TH-T4}$. At this point, the second pass transistor T4 turns on (before T3 turns on) and provides an initial pull-down path between the input signal line IN and the output signal line OUT. If fast pull-down characteristics are not required, the second pass transistor T4 may be omitted from the overvoltage protection circuit.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An overvoltage protection circuit, comprising:
  a pass transistor having first and second current carrying terminals electrically connected to an input signal line and an output signal line, respectively; and
  a voltage clamping circuit comprising first and second diodes electrically connected in antiparallel between a power supply line and a gate of said pass transistor, said voltage clamping circuit being sufficiently small and said pass transistor being sufficiently large that a total capacitance loading the gate of said pass transistor is less than two times a gate-to-channel capacitance of said pass transistor.

2. The circuit of claim 1, wherein said first and second diodes comprise first and second NMOS transistors, respectively.

3. The circuit of claim 2, wherein a source of the first NMOS transistor is electrically connected to a drain and gate of the second NMOS transistor and the gate of said pass transistor; and wherein a source of the second NMOS transistor is electrically connected to a drain and gate of the first NMOS transistor and the power supply line.

4. An overvoltage protection circuit, comprising:
  a pass transistor having first and second current carrying terminals electrically connected to an input signal line and an output signal line, respectively; and
  a voltage clamping circuit that is electrically connected to a power supply line and a gate of said pass transistor and is configured to dynamically clamp a capacitively bootstrapped variable voltage at the gate of said pass transistor within a first range so that magnitudes of all gate-to-source, gate-to-drain and drain-to-source voltages across said pass transistor do not exceed a voltage in excess of about Vdd when Vin is equal to about 2Vdd, where Vin equals a voltage of an input signal applied to the input signal line and Vdd equals a power supply voltage on the power supply line, said voltage clamping circuit being sufficiently small and said pass transistor being sufficiently large that a total capacitance loading the gate of said pass transistor is less than two times a gate-to-channel capacitance of said pass transistor.

5. The circuit of claim 4, wherein said voltage clamping circuit comprises a plurality of transistors; and wherein said voltage clamping circuit is configured to dynamically clamp a capacitively bootstrapped voltage at a gate of said pass transistor to within a first range so that magnitudes of all gate-to-source, gate-to-drain and drain-to-source voltages across said pass transistor and all the transistors within said voltage clamping circuit do not exceed a voltage in excess of about Vdd when Vin is equal to about 2Vdd.

6. The circuit of claim 4, wherein said voltage clamping circuit comprises an NMOS transistor that is connected as a diode between a power supply voltage and the gate of said pass transistor; and wherein a maximum voltage within the first range is equal to about Vdd+Vth, where Vth equals a threshold voltage of said NMOS transistor.

7. The circuit of claim 4, wherein said voltage clamping circuit comprises first and second diodes electrically connected in antiparallel between the power supply line and the gate of said pass transistor.

8. The circuit of claim 7, wherein said first and second diodes comprise first and second NMOS transistors, respectively.

9. The circuit of claim 8, wherein a source of the first NMOS transistor is electrically connected to a drain and gate of the second NMOS transistor and the gate of said pass transistor; and wherein a source of the second NMOS transistor is electrically connected to a drain and gate of the first NMOS transistor and the power supply line.

10. The circuit of claim 9, wherein said voltage clamping circuit and said pass transistor collectively drive the output signal line with an output signal having maximum positive voltage equal to about Vdd for Vin greater than Vdd.

11. The circuit of claim 9, wherein said voltage clamping circuit and said pass transistor are configured to collectively drive the output signal line with an output signal having a voltage that swings from a logic 0 reference level to a maximum positive voltage equal to about Vdd when Vin is switched from the logic 0 reference level to a positive voltage in a range between about Vdd and 2Vdd.

12. The circuit of claim 10, wherein a minimum voltage within the first range is equal to about Vdd−Vth1, where Vth1 equals a threshold voltage of the first NMOS transistor.

13. An overvoltage protection circuit, comprising:
first and second pass transistors of same conductivity type electrically connected in parallel between an input signal line and an output signal line;
a first power supply line electrically coupled to a gate of said second pass transistor and configured to receive a first power supply voltage;
a second power supply line configured to receive a second power supply voltage; and
a voltage clamping circuit comprising first and second diodes electrically connected in antiparallel between said second power supply line and a gate of said first pass transistor; and
wherein a threshold voltage of said second pass transistor and the first power supply voltage are at values that cause said second pass transistor to turn on before said first pass transistor when the input signal line is switched high-to-low relative to the first power supply voltage.

14. The circuit of claim 13, wherein said first and second diodes comprise first and second NMOS transistors, respectively; and wherein each of said first and second NMOS transistors is smaller than said first pass transistor.

15. The circuit of claim 14, wherein a source of the first NMOS transistor is electrically connected to a drain and gate of the second NMOS transistor and the gate of said first pass transistor; and wherein a source of the second NMOS transistor is electrically connected to a drain and gate of the first NMOS transistor and said second power supply line.

16. The circuit of claim 14, wherein said voltage clamping circuit is configured to clamp the gate of said first pass transistor at a maximum voltage of about $Vdd2+V_{TN2}$ in response to a positive input voltage transition in excess of about $V_{TN1}+V_{TN2}$ on the input signal line, where $V_{TN1}$ and $V_{TN2}$ are the threshold voltages of the first and second NMOS transistors, respectively.

17. The circuit of claim 16, wherein said voltage clamping circuit is configured to clamp a voltage at the gate of said first pass transistor at a minimum voltage of about $Vdd2-V_{TN1}$ in response to application of a logic 0 signal to the input signal line, where $V_{TN1}$ is a threshold voltage of the first NMOS transistor.

18. The circuit of claim 16, wherein said first and second pass transistors comprise third and fourth NMOS transistors, respectively; and wherein $V_{TN2}$ is about equal to a threshold voltage of the third NMOS transistor.

19. The circuit of claim 13, wherein said first and second power supply lines are electrically connected together.

20. An overvoltage protection circuit, comprising:
a first pass transistor having a first current carrying terminal electrically connected to an input signal line and a second current carrying terminal electrically connected to an output signal line;
a voltage clamping circuit that is electrically connected to a gate electrode of said first pass transistor and is configured to clamp a bootstrapped voltage at the gate electrode to a first voltage below a maximum voltage on the input signal line upon completion of a pull-up interval and is further configured to clamp the bootstrapped voltage at the gate electrode to a second voltage that is unequal to the first voltage and higher than a minimum voltage on the input signal line upon completion of a pull-down interval; and
a second pass transistor of same conductivity type as said first pass transistor and having a first current carrying terminal electrically connected to the input signal line, a second current carrying terminal electrically connected to the output signal line and a gate terminal that is held at a fixed voltage, said second pass transistor having a threshold voltage set at a value that causes said second pass transistor to turn on before said first pass transistor turns on when the input signal line switches high-to-low relative to the fixed voltage.

21. The circuit of claim 20, wherein the first voltage is greater than the second voltage.

22. The circuit of claim 21, wherein said voltage clamping circuit comprises first and second diodes electrically connected in antiparallel between a power supply line and the gate electrode.

* * * * *